（12) United States Patent
Fukushima et al.

(10) Patent No.: US 7,767,368 B2
(45) Date of Patent: Aug. 3, 2010

(54) METHOD OF FABRICATING PHOTOMASK BLANK

(75) Inventors: Noriyasu Fukushima, Niigata (JP); Hiroki Yoshikawa, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 406 days.

(21) Appl. No.: 11/882,729

(22) Filed: Aug. 3, 2007

(65) Prior Publication Data

US 2008/0076040 A1    Mar. 27, 2008

(30) Foreign Application Priority Data

Sep. 25, 2006    (JP) .............................. 2006-259302

(51) Int. Cl.
*G03F 1/00*    (2006.01)
(52) U.S. Cl. .......................................................... 430/5
(58) Field of Classification Search ..................... 430/5; 428/428, 430; 118/725; 219/730
See application file for complete search history.

(56) References Cited

U.S. PATENT DOCUMENTS 5,999,254 A    12/1999  Seibert et al.
2004/0105670 A1    6/2004  Kusuda et al.
2007/0092807 A1*   4/2007  Fukushima et al. ............ 430/5

FOREIGN PATENT DOCUMENTS

| JP | 7-140635 | 6/1995 |
|---|---|---|
| JP | 9-306921 | 11/1997 |
| JP | 11-260719 | 9/1999 |
| JP | 2004-000223 | 1/2004 |
| JP | 2004-179510 | 6/2004 |
| JP | 2004-199035 | 7/2004 |
| JP | 2004-247339 | 9/2004 |
| JP | 2007-114680 | 5/2007 |
| JP | 2007-114681 | 5/2007 |

OTHER PUBLICATIONS

Search Report dated Feb. 5, 2008 in Corresponding European Application No. EP 07 017215 (4 pages).

* cited by examiner

*Primary Examiner*—Stephen Rosasco
(74) *Attorney, Agent, or Firm*—Finnegan, Henderson, Farabow, Garrett & Dunner LLP

(57) ABSTRACT

An opaque area is formed in a sidewall portion of a susceptor by stacking a material that is transparent to flash light and a material that is opaque to the flash light to form the sidewall portion or coating a surface of the opaque material with the transparent material. A top surface of the opaque area in the sidewall portion of the susceptor is designed to have a predetermined positional relationship with a top surface of a substrate; the top surface of the opaque area is set at the same position as that of the top surface of the substrate or higher than the top surface of the substrate by a predetermined height. Thus, obliquely incident flash light is absorbed or irregularly reflected by the opaque quartz portion, surrounding an excavated portion of the susceptor.

20 Claims, 3 Drawing Sheets

METHOD OF FABRICATING PHOTOMASK BLANK

BACKGROUND OF THE INVENTION

1. Field of the Invention

The present invention relates to a method of fabricating a photomask blank, and more specifically, to a technique of fabricating a photomask blank as a material for a photomask used to micromachine semiconductor integrated circuits, CCDs (Charged-Coupled Devices), color filters for LCD (Liquid Crystal Display) devices, magnetic heads, and the like.

2. Description of the Related Art

Lithography techniques are used to, for example, fabricate semiconductor integrated circuits, which have been increasingly highly integrated. For the lithography techniques, efforts have been made to reduce the wavelength of exposure light used for light exposure apparatuses in order to improve resolution. According to a road map for lithography updated by ITRS (International Technology for Semiconductors) in 2004, the reduction in wavelength has progressed from a g line (wavelength $\lambda=436$ nm) and an i line ($\lambda=365$ nm) which are ultraviolet light sources to a KrF line ($\lambda=248$ nm) and an ArF line ($\lambda=193$ nm) which are far ultraviolet light sources. Further, the technology is expected to shift to ArF water immersion for a half pitch of 65 nm, hp 65, in 2007 and to a combination of $F_2$ or ArF water immersion and a resolution enhancement technology (RET) for a half pitch of 45 nm, hp45, in 2010.

Thus, demands for photomasks (and photomask blanks as materials for the photomasks) at the forefront of the technology are expected to be ensured at least until 2010. It is also pointed out that the lithography with photomasks is likely to be used for a half pitch of 32 nm, hp32, which is expected to be introduced in about 2013 and for a half pitch of 22 nm, hp22, which is expected to be introduced in about 2016.

According to the Rayleigh's equation, corresponding to an evaluation amount for resolution, resolution pitch RP and the depth of focus DOF are given by Formulae (1) and (2) using proportionality factors $k_1$ and $k_2$, respectively. Consequently, for miniaturization for the lithography technology, not only the reduced wavelength as described above but also an increased numerical aperture (NA) is required.

$$RP=k_1\lambda/NA \quad (1)$$

$$DOF=k_2\lambda/NA^2 \quad (2)$$

The "water immersion technique" has been gathering much attention as a technique for increasing the NA. The water immersion technique increases the NA value by filling a liquid of a refractive index (n) higher than that of an atmosphere (gas) in an exposure environment, between a wafer to be exposed and a lens provided closest to the wafer to set the NA value as refractive-index-value times (n times) as large as that of the liquid.

That is, if the spread of a light beam formed into an image at one point on the wafer to be exposed is defined as $\pm\theta$, $NA=n_0\cdot\sin\theta$ where $n_0$ denotes the refractive index of the wafer side. However, since the wafer side is usually air ($n_0=1$), $NA=\sin\theta$. Consequently, filling the liquid of the refractive index n in between the wafer to be exposed and the lens results in $NA=n\cdot\sin\theta$, enabling an increase in numerical aperture NA. This in turn enables a reduction in resolution pitch RP.

As is apparent from Formula (1), shown above, a reduction in $k_1$ factor is also an effective method for reducing the resolution pitch RP. RET for this purpose is based on "modified illumination" in which the shape of an effective light source, which is a simple circle, is modified, "multiple exposure" such as FLEX in which the wafer is exposed by being moved in the direction of the optical axis of a projective optical system using the same mask, or the like.

On the other hand, as is apparent from Formula (2), shown above, the reduction in exposure wavelength is effective for a reduction in resolution pitch RP but reduces the depth of focus DOF, affecting manufacturing yield. That is, in spite of the advantage of reducing the k factor to allow microstructures to be transferred, the reduction in exposure wavelength reduces the depth of focus DOF, resulting in a focus error and thus a decrease in manufacturing yield if the photomask is not sufficiently flat.

One method for solving this problem is phase shifting method. The phase shifting method uses a phase shift mask to form patterns such that the phases of adjacent patterns differ by about 180°. Specifically, a phase shift film provided in the phase shift mask changes the phase of exposure light by 180°. Consequently, light having passed through an area in which the phase shift film pattern is formed and light having passed through an area in which the phase shift film is not present have a light intensity of 0 at the boundary between the areas. This leads to a light intensity distribution indicating a rapid change in that area. As a result, a high DOF can be obtained, improving image contrast. The phase shift mask includes a Levenson type and a halftone type. In particular, using the halftone phase shift mask drastically improves the DOF.

For the halftone phase shift mask, a single layer mask having a relatively simple structure has been proposed. Proposed single layer phase shift masks have a phase shift film consisting of molybdenum silicide oxide (MoSiO) or molybdenum silicide oxinitride (MoSiON). For more information, see, for example, Japanese Patent Laid-Open No. 7-140635 (Patent Document 1).

To fabricate such a phase shift mask, a method is used which forms patterns for a phase shift mask blank by the lithography method. The lithography method involves applying a resist on a phase shift mask blank, exposing a desired portion to an electron beam or an ultraviolet ray, and then developing the phase shift mask blank to expose the surface of the phase shift film which has been exposed to the electron beam or ultraviolet ray. The exposed phase shift film is etched away through the patterned resist film as a mask to expose a substrate surface. The resist film is subsequently stripped to obtain a phase shift mask.

When a plurality of masks are used to form a multilayer structure for a device, a high overlapping efficiency is required. Increasingly miniaturized patterns further increase the required overlapping efficiency.

However, if stress is already accumulated in the thin film formed on the substrate which is in the form of a photomask blank, then while patterns are being drawn on the blank through the steps of resist application, exposure, development, etching, and resist stripping, the stress accumulated in the film is partly released. The resulting photomask is thus distorted. The distortion may reduce the overlapping accuracy of the photomask, causing defects in a circuit pattern to be drawn.

The level of the "distortion" depends on the pattern to be drawn and the magnitude of the stress accumulated in the film. It is very difficult to control or release the stress during the process of fabricating a photomask.

This problem can be avoided by forming thin films under conditions in which the stress of each thin film is almost zeroed. However, it is very difficult and virtually impossible to find fabrication process conditions in which film formation conditions for providing appropriate properties for thin films used as optical films also serve as conditions for forming thin films with reduced stress. It is thus necessary to have a step of forming thin films under conditions in which the appropriate properties of the thin films can be obtained and a separate step of reducing the stress of the thin films.

The thin films in the photomask blank such as the phase shift mask are generally formed by sputtering. However, stress may occur in the films during the film formation process and distort the substrate itself, warping the photomask blank. To solve this problem, a technique has been proposed which involves irradiating a light-absorbing thin film such as the phase shift film with light from a flash lamp at a predetermined energy density to control the film stress so that the distortion of the photomask blank is reduced. For more information on this technique, see, for example, Japanese Patent Laid-Open No. 2004-0223 (Patent Document 2).

Possible external energy applying means for reducing the stress of thin films include a hot plate, a heater, a halogen lamp, an infrared lamp, a furnace, and RTA (Rapid Thermal Anneal). However, owing to excessive energy application, resulting in an increase in substrate temperature, these techniques may damage the substrate itself or increase the time required for treatment. This disadvantageously degrades productivity. Consequently, light irradiation using a flash lamp such as the one described in Japanese Patent Laid-Open No. 2004-0223 (Patent Document 2) is excellent.

However, light irradiation using a flash lamp may increase the amount of light applied to an outer peripheral area of an optical film formed on the substrate above the amount of light applied to a central area due to reflection from a susceptor holding the substrate by a back surface of the substrate. This unfortunately causes an in-plane variation in the optical properties of the films.

SUMMARY OF THE INVENTION

The present invention is designed in view of the above problems. An object of the present invention is to provide a photomask blank comprising an optical film undergoing reduced stress and offering in-plane uniform optical properties.

To accomplish the object, the present invention provides a method of fabricating a photomask blank, the method comprising a step of irradiating an optical film formed on a transparent substrate with flash light, the flash light irradiation being performed using a susceptor having an excavated portion that accommodates the transparent substrate and a sidewall portion surrounding the excavated portion, the sidewall portion having an opaque area that is opaque to flash light, wherein a difference ($H=H_1-H_2$) between the height ($H_1$) of a top surface of the opaque area and the height ($H_2$) of a top surface of the transparent substrate accommodated in the excavated portion is within the range from 0.0 to 2.5 mm.

Preferably, the value of H is within the range from 1.0 to 2.0 mm.

The susceptor may be configured to comprise a sidewall portion in which a layer of the opaque area and a transparent layer are stacked. The opaque area comprises, for example, opaque quartz glass.

According to the present invention, preferably, the excavated portion of the susceptor has an opaque area that is opaque to the flash light, and the opacity of the excavated portion to the flash light is such that transmittance determined using an integrating sphere is at most 85% all over a wavelength region from 300 to 600 nm.

The optical film is, for example, a phase shift film.

According to the present invention, in the step of irradiating the optical film formed on a principle surface of the transparent substrate with flash light, the susceptor is used, which has the excavated portion that accommodates the transparent substrate and the sidewall portion surrounding the excavated portion. The sidewall portion partly constitutes the opaque area. The difference in height between the top surface of the opaque area and the top surface of the transparent substrate accommodated in the excavated portion has a predetermined value. Thus, during flash light irradiation, an area located close to an end of the substrate is inhibited from being excessively irradiated with flash light. This makes it possible to provide a photomask blank comprising an optical film undergoing reduced stress and offering in-plane uniform optical properties.

BRIEF DESCRIPTION OF THE DRAWINGS

Other objects, features and advantages of the present invention will become more apparent from the following detail description when read in conjunction with the accompanying drawings in which.

DESCRIPTION OF THE PREFERRED EMBODIMENTS

The best mode for carrying out the present invention will be described with reference to the drawings.

The present inventors have gained the following knowledge through dedicated efforts to improve the in-plane distribution of an optical film obtained by flash light irradiation. A certain area located close to an end of a principle surface of a substrate is not covered with an optical film. This may result in a phenomenon in which flash light incident on that area passes through the substrate without being absorbed by the optical film to cause reflection between a susceptor and a back surface of the substrate. The reflection by the back surface of the substrate causes the temperature of an outer peripheral area of the optical film to increase differently from the temperature of the other areas (the difference in temperature conditions). The in-plane ununiformity in temperature conditions causes the in-plane ununiformity in the optical properties of the optical film.

Figure 1A:
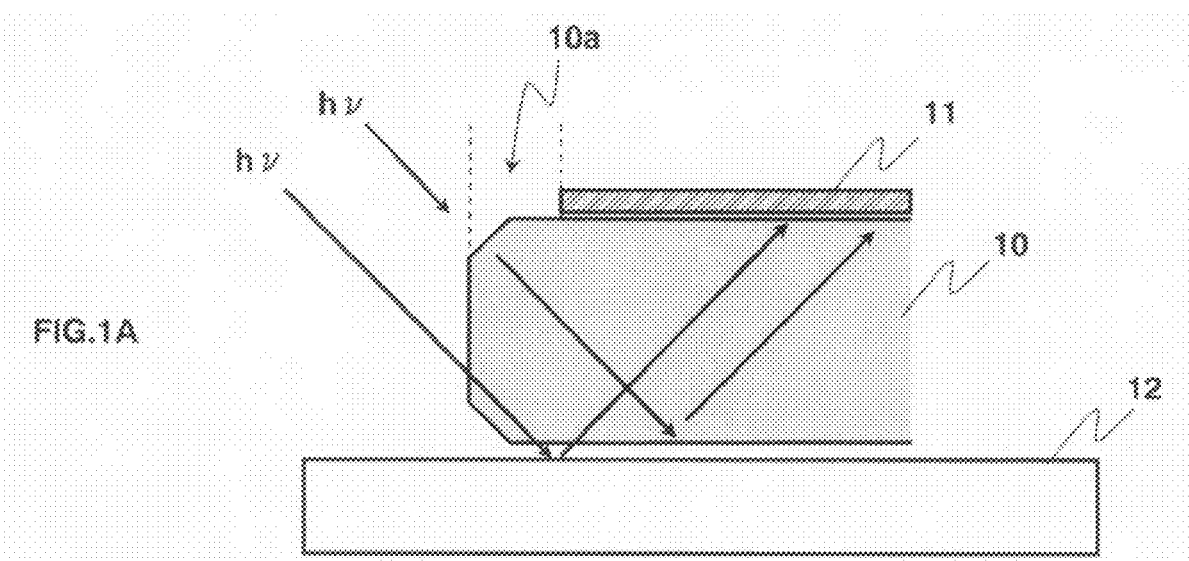
FIGS. 1A and 1B are diagrams illustrating reflection from a susceptor which may cause an in-plane variation in the optical properties of an optical film.
Figure 1B:
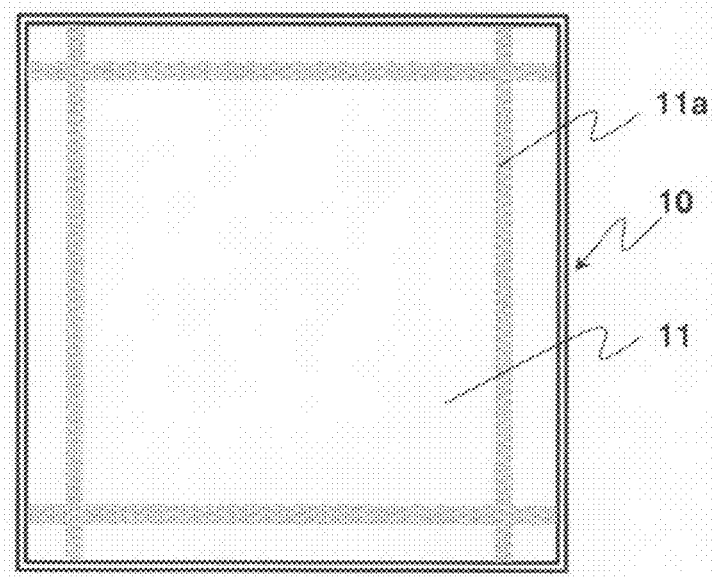

FIGS. 1A and 1B are diagrams illustrating reflection from a susceptor which may cause an in-plane variation in the optical properties of an optical film. FIG. 1A is a sectional view illustrating how flash light operates in the vicinity of the end (peripheral edge) of the substrate which is irradiated with flash light. FIG. 1B is a plan view conceptually showing areas of the optical film formed on a principle surface of the substrate which exhibit abnormal optical properties if the incidence and refection of flash light shown in FIG. 1A occur.

As shown in FIG. 1A, ends of a common substrate 10 are chamfered so as to taper and thus prevented from suffering from cracks or the like during a process of fabricating a photomask blank (and during the use of a photomask). An optical film 11 is not formed all over the principle surface of the substrate 10 but a substrate surface is exposed from a substrate end area 10*a*. The substrate end area 10*a* generally has a width of about 1 mm.

During flash light irradiation, flash light enters the substrate 10 placed on the susceptor 12 not only perpendicularly but also obliquely to the substrate 10 as shown in the figure. Flash light having entered the substrate 10 obliquely through the substrate end area 10*a* passes through the substrate 10 without being absorbed by the optical film 11. The flash light is reflected by a back surface of the substrate, and the reflected light is emitted through a back surface of the optical film 11 formed on the principle surface of the substrate 10. The reflection by the back surface of the substrate may also occur in other areas of the optical film 11. However, in this case, the incident light is absorbed by the optical film 11 before the transmitted light with a reduced intensity is reflected by the back surface of the substrate and re-enters the optical film 11.

Consequently, the film (an outer peripheral area of the optical film 11) located close to the substrate end area 10*a* is irradiated with more flash light than the other areas owing to the back surface reflection of incident light not absorbed by the optical film 11.

The outer peripheral area of the optical film 11 provided with more light irradiation energy than the other areas is likely to exhibit abnormal optical properties. For example, as shown in FIG. 1B, a phenomenon has been observed in which a band-like optical property area 11*a* extending parallel to sides of the substrate 10 is formed in the outer peripheral area of the optical film 11, located close to end of the substrate 10.

Thus, in the present invention, an "excavated portion" is formed in the susceptor on which the substrate is placed for flash light irradiation. The substrate is then placed in the "excavated portion" for flash light irradiation. Then, the height (excavation depth) of a sidewall portion surrounding the "excavated portion" is adjusted to inhibit the back surface reflection to the outer peripheral area of the optical film to make the amount of flash light irradiation in the plane of the optical film uniform.

Figure 2A:
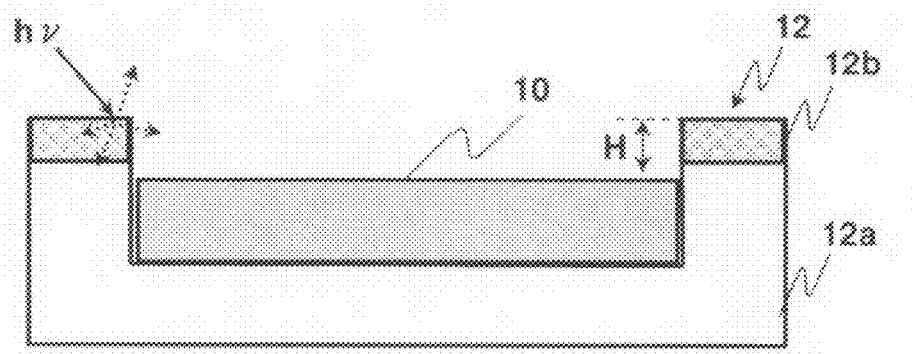
FIGS. 2A-2D are diagrams illustrating an example of the basic structure of a susceptor used in the present invention.
Figure 2B:
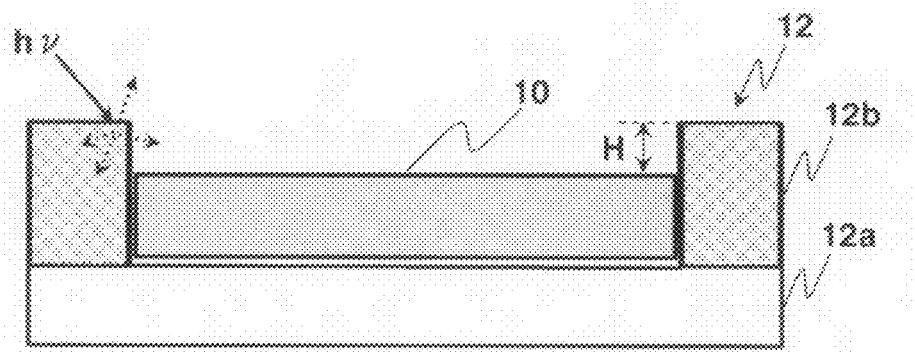
Figure 2C:
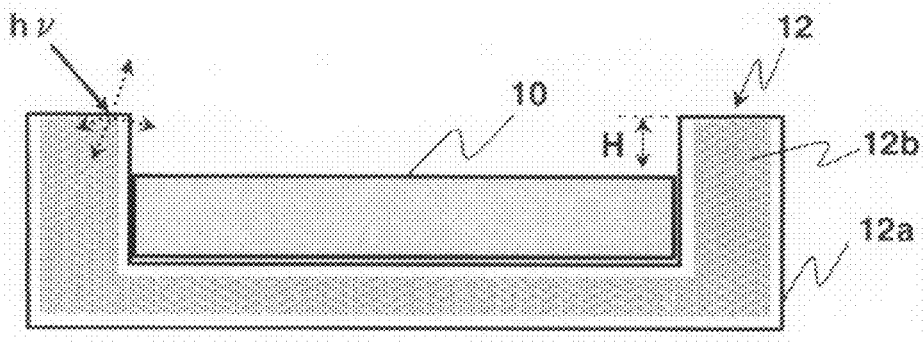

FIGS. 2A to 2C are diagrams illustrating an example of the basic structure of the susceptor used in the present invention. FIG. 2A shows a structure in which the sidewall portion of the susceptor 12 is formed by stacking a material (12*a*) that is transparent to flash light and a material (12*b*) that is opaque to flash light. FIG. 2B shows a structure in which the sidewall portion is formed only of the opaque material (12*b*). FIG. 2C shows a structure in which a surface of the opaque material (12*b*) is covered with a thin transparent material (12*a*). In all of the illustrated susceptors, the top surface of the sidewall portion is formed of the opaque material (12*b*).

Here, the transparent material shown by reference numeral 12*a* is, for example, transparent quartz glass. The transparent material shown by reference 12*b* is opaque quartz (consisting of cellular quartz glass). The opacity of the opaque material (12*b*) to flash light is set at a value within an appropriate range on the basis of a selected material and a set thickness, taking into account the relationship with conditions such as the composition and thickness of the optical film formed on the substrate 10 as well as irradiation light energy for flash light process.

The height of the sidewall portion of the susceptor 12 is designed to have a predetermined relationship with the position of the top surface of the substrate 10. In the illustrated example, the sidewall portion is higher than the top surface of the substrate 10 by a predetermined value (H). Further, the sidewall portion is (at least partly) composed of a material that is opaque to flash light. As shown in the figure, obliquely incident flash light (shown by hv) is absorbed or irregularly reflected by the opaque quartz portion 12*b* of the sidewall portion, surrounding the excavated portion of the susceptor 12. This prevents a phenomenon in which flash light having impinged directly on the end area of the substrate 10 is reflected by the back surface of the substrate 10 or flash light having impinged obliquely on the sidewall portion of the susceptor 12 directly enters the surface of the excavated portion and is then reflected toward the substrate surface. This in turn reduces the degree to which the back surface reflected light enters the back surface of the optical thin film formed on the principle surface of the substrate 10 to provide excess optical energy to the optical film.

Figure 2D:
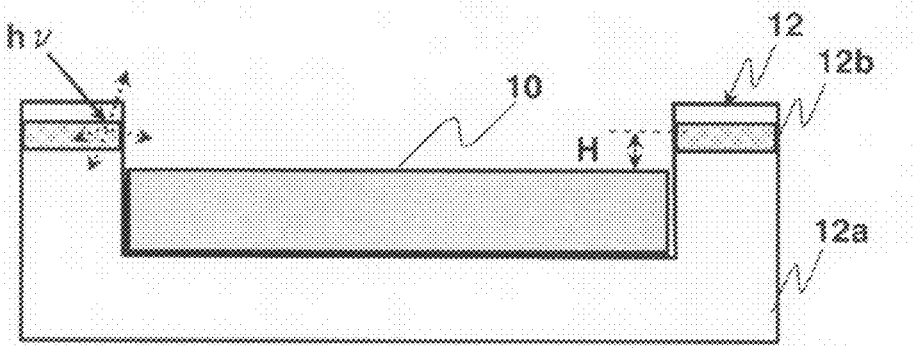

FIGS. 2A to 2C show the aspect of a susceptor in which the top surface side of the side wall portion is formed of the opaque material (12*b*). In these figures, the difference in height between the top surface of the sidewall portion of the susceptor 12 and the top surface of the substrate 10 is defined as H. However, if the sidewall has a further layer of a transparent material stacked on the opaque material (12*b*) (see FIG. 2D), the value H is given by the difference in position between the top surface of the transparent material (12*b*) layer and the top surface of the substrate.

By irradiating the thus configured susceptor with flash light from a flash lamp to relax the stress in the optical film, it is possible to make the amount of flash light irradiation uniform to relax the stress of the optical film with the properties of the optical film and the in-plane uniformity maintained. For example, an optical film (for example, a phase shift film) that can absorb light emitted by the flash lamp is formed on a transparent substrate such as synthetic quartz glass or fluorinated calcium. The substrate is then placed on the susceptor configured as described above. The optical film is then irradiated with flash light to relax the stress in the film. Another optical film or the like is then formed on the above optical film as required, to obtain a photomask blank.

Examples of the optical film irradiated with flash light include a phase shift film, a shielding film, and an antireflective film which is formed into a photomask blank. Under general flash light irradiation conditions, the film is irradiated with flash light of wavelength at least 300 nm at energy of about 20 J/cm$^2$ per about 1 millisecond. If the film has an excessively high capability of absorbing light of that wavelength, the film may be destroyed unless special extinction means is used. In this regard, the phase shift film (particularly a halftone phase shift film) itself has a certain level of extinction effect. Accordingly, with the phase shift film, the possibility of film destruction caused by flash light irradiation is not so high. That is, the flash light irradiation is suitable for the manufacture of phase shift mask blanks. If the optical film irradiated with flash light is a halftone phase shift film, a shielding film, an antireflective film, or the like is formed after the flash light irradiation to obtain a halftone phase shift mask blank.

The flash lamp is a light source that has a short light emission time and exhibits a wide, continuous wavelength region at a high illuminance, and is, for example, a xenon flash lamp. Thus, as opposed to a laser light source, the flash lamp eliminates the need for a light absorbing film that can excellently absorb light of a particular wavelength. Consequently, constraints such as the film composition on which stress control can be performed in association with the flash light irradiation technique are very moderate. The flash lamp is thus widely applicable. The flash lamp also eliminates the need to scan irradiation light on the substrate. The entire surface of the substrate can be irradiated with light (provided with energy) in a short time. The flash lamp further has a spectrum covering a wide wavelength region, allowing irradiation effects of light of various wavelengths to be simultaneously produced.

When the optical film (flash light absorbing film) such as the halftone phase shift film is irradiated with the flash light described above, absorption of the irradiation light, a rapid change in temperature, or the like changes the film composition, the bonding state of atoms, and the like to relax the stress.

Embodiment

First, a halftone phase shift film of MoSiON was formed on a square quartz substrate of 6 inches square to a film thickness of 700 Å by reactive DC sputtering. The phase shift film exhibited a phase difference of 180° for exposure light from an ArF excimer laser (193 nm) and a transmittance equal to about 6% of that of a bare substrate. After being heated to 80° C., the substrate (that is, a substrate with a phase shift film) was placed on the susceptor with the excavated portion so that the phase shift film faces upward. The substrate was irradiated, from above, with light from the xenon flash lamp. At this time, susceptors of the type shown in FIG. 2C which have different excavation heights (that is, the heights of the sidewall portions of the susceptors) were prepared. Flash light irradiation was performed using each of the susceptors.

Figure 3:
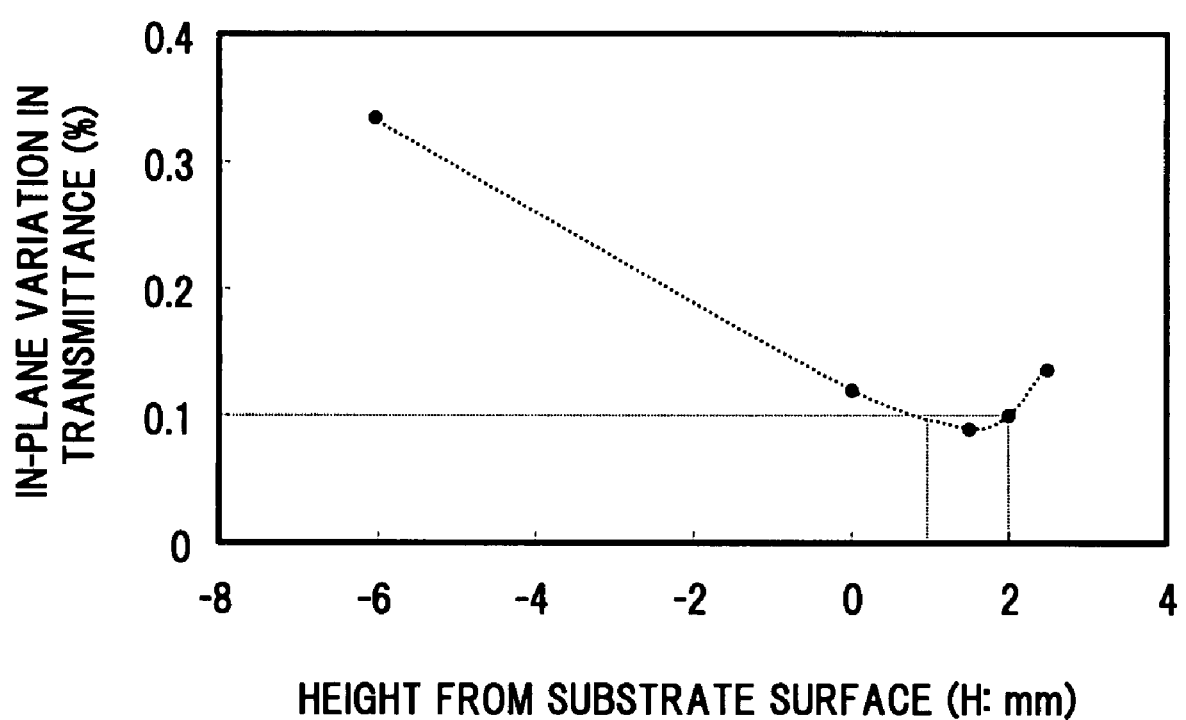
FIG. 3 is a diagram showing an in-plane variation in the transmittance of a halftone phase shift film observed after flash light irradiation, in which the axis of abscissa indicates the difference (H) in position between a top surface of a sidewall of the susceptor and a top surface of a substrate.

FIG. 3 is a diagram showing an in-plane variation in the transmittance of the halftone phase shift film observed after flash light irradiation, in which the axis of abscissa indicates the difference (H) in position between the top surface of the sidewall of the susceptor used and the top surface of the substrate used.

As shown in the figure, the in-plane variation in transmittance depends on the excavation depth of the susceptor. When the sidewall top surface is lower than the substrate top surface (a negative H value), the variation is relatively great. When the phase shift film is irradiated with flash light using a susceptor with an H value of −6 mm, the in-plane variation is about 0.35%. However, making the sidewall top surface closer to the position of the substrate top surface increases the in-plane uniformity. With a susceptor with the sidewall top surface aligned with the substrate top surface (H=0 mm), the in-plane variation is about 0.12%. Moreover, with H =+1.5 mm where the sidewall top surface is located above the substrate top surface, the variation exhibits a minimum value of about 0.09%. A subsequent increase in H value tends to gradually increase the in-plane variation (about 0.10% when H=+2.0 mm, about 0.14% when H=+2.5 mm).

The reason why the variation is relatively great when the sidewall top surface is lower than the substrate top surface is expected to be as follows. As already described, the vicinity of the end of the substrate principle surface is not covered with the phase shift film. Consequently, flash light is reflected between the susceptor and the substrate without being absorbed by the phase shift film. This makes the temperature in the film plane non-uniform during a flash light irradiation process.

The reason why the in-plane variation increases gradually after the variation has exhibited the minimum value at H=+1.5 mm is expected to be as follows. An excessively high sidewall shields a part of the phase shift film from flash light. This light shielding effect makes the temperature in the film plane non-uniform during a flash light irradiation process.

The results shown in FIG. 3 indicate that provided that the H value is within the range from 0.0 to +2.5 mm, the value of the in-plane variation in transmittance can be kept less than 0.15%. Further, provided that the H value is within the range from +1.0 to +2.0 mm, the in-plane variation value can be kept at most 0.10%.

In the above embodiment, the "cellular glass", consisting of quartz glass, is used as an opaque material for the susceptor. However, the material is not limited to this. Further, various forms of the susceptor other than the type illustrated in FIG. 2 are possible. Alternatively, the susceptor may be composed entirely of an opaque material or of a stack of a plurality of opaque and transparent layers.

A susceptor with an excavated portion formed of an opaque material as in the case of the susceptor shown in FIG. 2C has a low transmittance (a high reflectance) for flash light to the excavated portion. As a result, flash light applied perpendicularly to the substrate passes through the substrate, is reflected by the susceptor surface, and enters the substrate again. This enhances flash light components contributing to controlling the stress of the optical film, provided on the principle surface of the substrate. This in turn makes it possible to effectively utilize optical energy contributing to controlling the stress of the optical film, allowing the irradiation light energy to be set at a reduced value. The reduced flash light irradiation energy effectively ensures the uniform in-plane distribution of the optical properties of the optical film.

In this case, the "opacity" of the excavated portion is such that all over the wavelength region from 300 to 600 nm, the transmittance determined using an integrating sphere (for example, Shimadzu Ultraviolet Visible Spectrophotometry, UV-2400PC) is at most 85% (more preferably at most 80%, most preferably at most 75%). A possible method for controlling the "opacity" is, for example, to execute an HF treatment to set the roughness of the surface of the opaque material at an appropriate value, to adjust the size or density of "cells" in the cellular glass, or when transparent glass and cellular glass are stacked, to adjust the layer thickness of the cellular glass.

To allow the amount of distortion (the amount of stress) accumulated in the optical film such as the phase shift film to be easily controlled, the amount of flash light irradiation is controlled so as to provide at most a predetermined amount of optical energy. This is because an excessively large flash light irradiation amount may impair the film quality of the optical film and because excessive irradiation may destroy the film. The "predetermined amount" of flash light irradiation energy depends on the optical properties of the optical film provided in a photomask blank to be produced. For example, for a phase shift mask, the predetermined amount" depends on the film thickness and transmittance of the phase shift film.

Examples of the phase shift film include an amorphous silicon film and a metal compound film containing oxygen, nitrogen, carbon, or the like. In particular, an excellent optical property controllability is exhibited by a phase shift film including one or more layers containing silicon, metal other than silicon, and one or more types of elements selected from a group consisting of oxygen, nitrogen, and carbon. Examples of the metal other than silicon which is contained in the phase shift film include W, Mo, Ti, Ta, Zr, Hf, Nb, V, Co, Cr, and Ni. In terms of a reduction in warpage after flash light irradiation or an improvement in chemical resistance, Mo-based metal is preferred. Examples of a phase shift film of such a composition include molybdenum silicide oxide (MoSiO), molybdenum silicide nitride (MoSiN), molybdenum silicide carbide (MoSiC), molybdenum silicide oxinitride (MoSiON), molybdenum silicide oxicarbide (MoSiOC), and molybdenum silicide oxinitride carbide (MoSiONC). Such a molybdenum silicide-based phase shift film can be formed by reactive sputtering using MoSi or the like as a target.

When the above molybdenum-silicide-based film is used as a phase shift film to be irradiated with flash light, the film can be adapted for KrF, ArF, or $F_2$ laser exposure. Within the wavelength range from 200 to 1,100 nm, the transmittance increases in order of KrF, ArF, and $F_2$. That is, since the efficiency of light absorption varies depending on the film quality, the irradiation energy of the flash lamp has appropriate regions for the respective laser exposure cases and needs to increase in order of KrF, ArF, and $F_2$.

Specifically, for a phase shift film having a transmittance of 5 to 7% for light of a wavelength equal to that of a KrF laser (248 nm), the predetermined amount of flash light irradiation energy is at most 21.5 $J/cm^2$ when measured with a calorimeter. For a phase shift film having a transmittance of 5 to 7% for light of a wavelength equal to that of an ArF laser (193 nm), the predetermined amount of flash light irradiation energy is at most 32.5 $J/cm^2$. For a phase shift film having a transmittance of 5 to 7% for light of a wavelength equal to that of an $F_2$ laser (157 nm), the predetermined amount of flash light irradiation energy is at most 41.5 $J/cm^2$. Observations with a Nomarski microscope show that when the phase shift film was irradiated with flash light at an optical energy of a value larger than those described above, the phase shift film on the substrate surface was partly destroyed.

According to the present invention, a unit light emission time (the time required for a single light emission) for the flash lamp is generally set within the range from 100 μsec to 1 sec. Setting a shorter irradiation time for the flash lamp tends to shift the irradiation wavelength toward a shorter wavelength side. Setting a longer irradiation time for the flash lamp tends to shift the irradiation wavelength toward a longer wavelength side. Thus, in the present embodiment, the unit light emission time was set within the range from 0.1 msec to 100 msec. Specifically, the irradiation time was set at about 1 msec.

The technique for fabricating a photomask blank in accordance with the present invention has been described with reference to the embodiment. The embodiment is only an example for carrying out the present invention. The present invention is not limited to the embodiment. Variations to the embodiment fall within the scope of the present invention. As is obvious from the above description, various other embodiments are possible without departing from the scope of the present invention.

The present invention provides a method for fabricating a photomask blank comprising an optical film undergoing reduced stress and offering in-plane uniform optical properties.

What is claimed is:

1. A method of fabricating a photomask blank, the method comprising:
   a step of irradiating an optical film formed on a transparent substrate with flash light,
   the flash light irradiation being performed using a susceptor having an excavated portion that accommodates the transparent substrate and a sidewall portion surrounding the excavated portion,
   the sidewall portion having an opaque area that is opaque to flash light, wherein a difference ($H=H_1-H_2$) between the height ($H_1$) of a top surface of the opaque area and the height ($H_2$) of a top surface of the transparent substrate accommodated in the excavated portion is within the range from 0.0 to 2.5 mm.

2. The method of fabricating the photomask blank, according to claim 1, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

3. The method of fabricating the photomask blank, according to claim 1, wherein the optical film is a phase shift film.

4. The method of fabricating the photomask blank, according to claim 1, wherein the opaque area comprises opaque quartz glass.

5. The method of fabricating the photomask blank, according to claim 4, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

6. The method of fabricating the photomask blank, according to claim 1, wherein the value of H is within the range from 1.0 to 2.0 mm.

7. The method of fabricating the photomask blank, according to claim 6, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

8. The method of fabricating the photomask blank, according to claim 6, wherein the optical film is a phase shift film.

9. The method of fabricating the photomask blank, according to claim 6, wherein the opaque area comprises opaque quartz glass.

10. The method of fabricating the photomask blank, according to claim 9, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

11. The method of fabricating the photomask blank, according to claim 1, wherein the susceptor comprises the sidewall portion in which a layer of the opaque area and a transparent layer are stacked.

12. The method of fabricating the photomask blank, according to claim 11, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

13. The method of fabricating the photomask blank, according to claim 11, wherein the optical film is a phase shift film.

14. The method of fabricating the photomask blank, according to claim 11, wherein the opaque area comprises opaque quartz glass.

15. The method of fabricating the photomask blank, according to claim 14, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

16. The method of fabricating the photomask blank, according to claim 6, wherein the susceptor comprises the sidewall portion in which a layer of the opaque area and a transparent layer are stacked.

17. The method of fabricating the photomask blank, according to claim 16, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

18. The method of fabricating the photomask blank, according to claim 16, wherein the optical film is a phase shift film.

19. The method of fabricating the photomask blank, according to claim 16, wherein the opaque area comprises opaque quartz glass.

20. The method of fabricating the photomask blank, according to claim 19, wherein the excavated portion of the susceptor has an opaque area that is opaque to the flash light, and the opacity of the excavated portion to the flash light is such that transmittance determined using an integrating sphere is at most 85% all over a wavelength region from 300 to 600 nm.

\* \* \* \* \*